US009948808B2

(12) United States Patent
Sato

(10) Patent No.: US 9,948,808 B2
(45) Date of Patent: Apr. 17, 2018

(54) INFORMATION PROCESSING APPARATUS HAVING CIRCUIT CONFIGURATION DATA INSTALLED BASED ON IDENTIFIER CORRESPONDENCE, METHOD FOR CONTROLLING THE SAME, AND STORAGE MEDIUM

(71) Applicant: CANON KABUSHIKI KAISHA, Tokyo (JP)

(72) Inventor: Yoshikazu Sato, Nagareyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/270,931

(22) Filed: Sep. 20, 2016

(65) Prior Publication Data

US 2017/0094090 A1 Mar. 30, 2017

(30) Foreign Application Priority Data

Sep. 24, 2015 (JP) ................................. 2015-186295

(51) Int. Cl.
*H04N 1/00* (2006.01)
*H03K 19/177* (2006.01)

(52) U.S. Cl.
CPC ....... *H04N 1/00962* (2013.01); *H03K 19/177* (2013.01); *H04N 1/00912* (2013.01); *H04N 2201/0094* (2013.01)

(58) Field of Classification Search
None
See application file for complete search history.

(56) References Cited

U.S. PATENT DOCUMENTS

2010/0225948 A1* 9/2010 Sato .................. H04N 1/00965
358/1.13
2014/0006766 A1* 1/2014 Ito ....................... G06F 9/44505
713/2

FOREIGN PATENT DOCUMENTS

JP 2013-098823 A 5/2013

* cited by examiner

*Primary Examiner* — Andrew H Lam
(74) *Attorney, Agent, or Firm* — Canon U.S.A., Inc. IP Division

(57) ABSTRACT

Prior to CPU master configuration, an information processing apparatus checks consistency of each piece of circuit configuration data required for a programmable logic device to prevent malfunctions of the information processing apparatus. A method for controlling the information processing apparatus having a programmable processing unit requiring at least two pieces of circuit configuration data for circuit configuration includes storing a first identifier included in first circuit configuration data set in the programmable processing unit, and performing, based on the first identifier stored in the storage unit and a second identifier included in second circuit configuration data, control to install the second circuit configuration data.

9 Claims, 10 Drawing Sheets

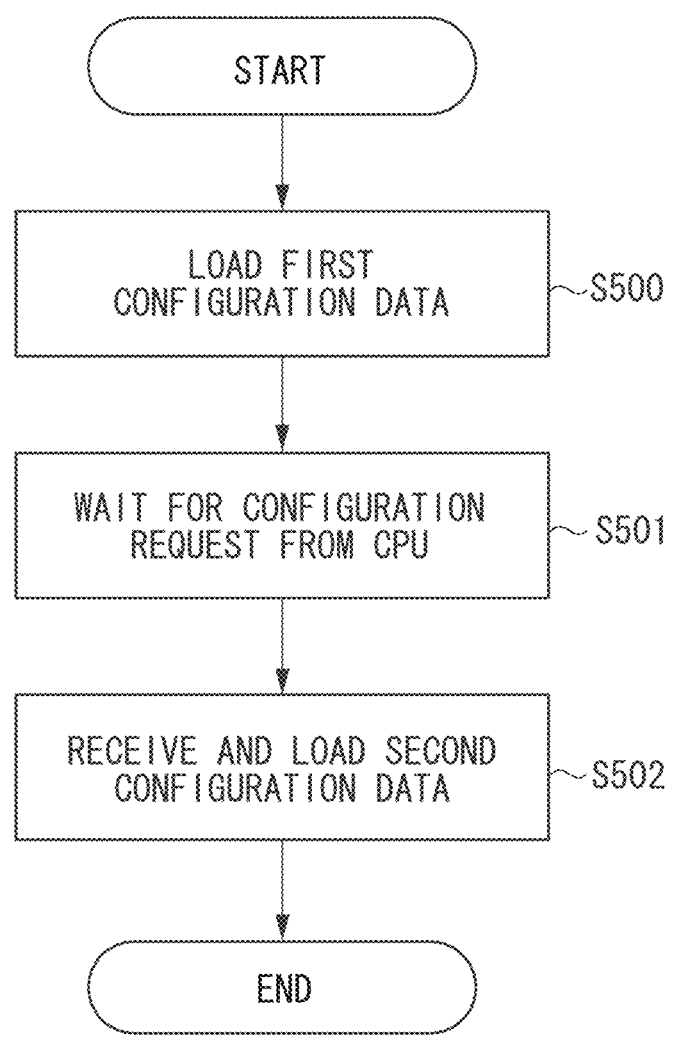

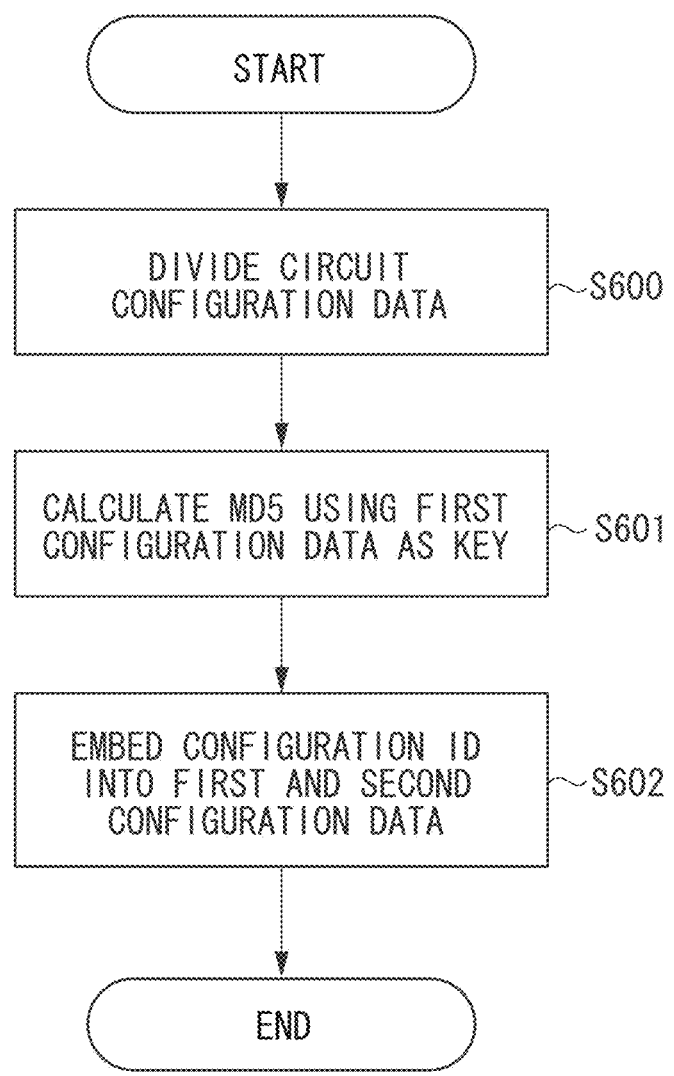

US 9,948,808 B2

INFORMATION PROCESSING APPARATUS HAVING CIRCUIT CONFIGURATION DATA INSTALLED BASED ON IDENTIFIER CORRESPONDENCE, METHOD FOR CONTROLLING THE SAME, AND STORAGE MEDIUM

BACKGROUND OF THE INVENTION

Field of the Invention

The present invention relates to an information processing apparatus having a programmable logic device, a method for controlling the information processing apparatus, and a storage medium.

Description of the Related Art

As a Field-Programmable Gate Array (FPGA) configuration method, a certain technique performs a configuration by using a central processing unit (CPU) as a master device. Hereinafter, this method is referred to as a "CPU master configuration". Generally, in the CPU master configuration, a configuration is performed in two steps (refer to Japanese Patent Application Laid-Open No. 2013-098823).

The configuration in the first step (hereinafter referred to as a "first configuration") is performed when power is supplied to an FPGA, and circuit configuration data (hereinafter referred to as "first configuration data") is loaded into the FPGA from a read only memory (ROM) connected to the FPGA. The first configuration is performed without CPU's intervention. The first configuration data includes hardware intellectual property (IP) circuit and input/output (I/O) circuit data.

The configuration in the second step (hereinafter referred to as a "second configuration") is performed by the CPU at an arbitrary timing after completion of the first configuration. Circuit configuration data (hereinafter referred to as "second configuration data") is loaded into the FPGA from a hard disk drive (HDD) connected to the CPU. The second configuration data includes user logic circuit configuration data.

The CPU master configuration is mainly characterized in that the second configuration data is easily installed to an apparatus concerned. As described above, the second configuration data is stored in a secondary storage device (an HDD, a solid state drive (SSD), etc.) accessible from the CPU, and therefore can be installed from a removable medium or a network server at an arbitrary timing. The term installation means storing data in secondary storage devices from the outside, and does not include configuration operations.

Meanwhile, when handling the CPU master configuration, it is necessary to note consistency between the first and the second configuration data. The term "consistency" means combining the first and the second configuration data to achieve a normally operable FPGA circuit.

Conventionally, to check the consistency between the first and the second configuration data, there was no choice but to perform the CPU master configuration and check whether the FPGA normally operates. Therefore, the second configuration data that is inconsistent with the first configuration data may be installed, and in this case the FPGA does not normally operate. This caused complexity in installation works and malfunctions of the apparatus.

SUMMARY OF THE INVENTION

According to an aspect of the present invention, an information processing apparatus having a programmable processing unit requiring at least two pieces of circuit configuration data for circuit configuration includes a storage unit configured to store a first identifier included in first circuit configuration data set in the programmable processing unit, and a control unit configured to, based on the first identifier stored in the storage unit and a second identifier included in second circuit configuration data, perform control to install the second circuit configuration data.

Further features of the present invention will become apparent from the following description of exemplary embodiments with reference to the attached drawings.

BRIEF DESCRIPTION OF THE DRAWINGS

FIG. 5 is a flowchart illustrating an example of a sequence for loading the circuit configuration data according to the present exemplary embodiment.

FIG. 6 is a flowchart illustrating an example of a sequence for generating a first configuration data identifier (ID) and a second configuration data ID according to the present exemplary embodiment.

DESCRIPTION OF THE EMBODIMENTS

Figure 1:
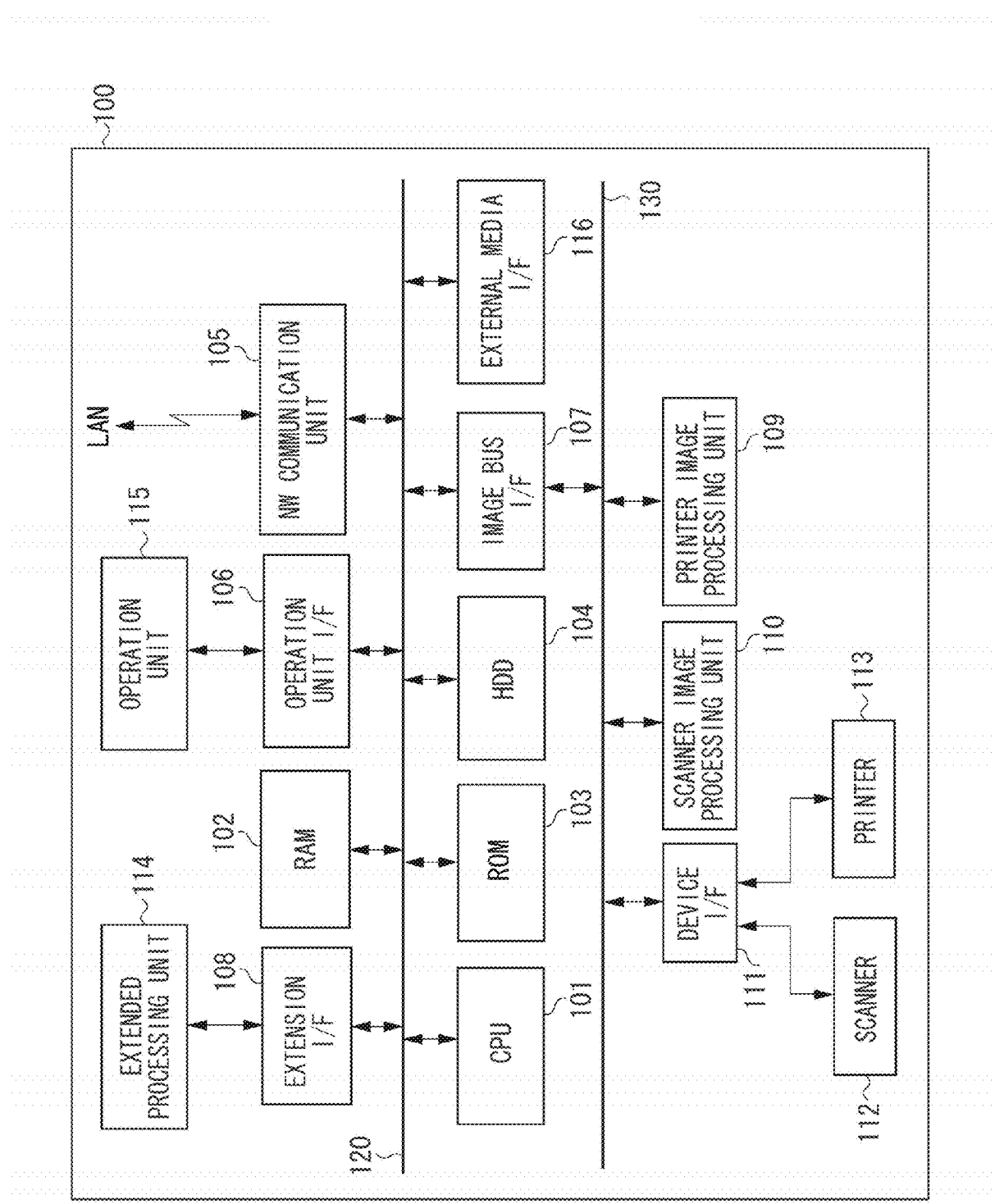
FIG. 1 illustrates an example of an entire configuration of an image forming apparatus according to the present exemplary embodiment.

Exemplary embodiments of the present invention will be described in detail below with reference to the accompanying drawings. In each drawing, elements having identical functions are assigned the same reference numeral and duplicated descriptions thereof will be suitably omitted.

<Configuration of Image Forming Apparatus 100>

FIG. 1 illustrates an example of an entire configuration of an image forming apparatus according to a first exemplary embodiment as an example of an information processing apparatus of the present invention.

FIG. 1 illustrates an image forming apparatus (image processing apparatus) 100 as an example of the information processing apparatus of the present invention. The image forming apparatus 100 is a multi-function peripheral for inputting/outputting and transmitting/receiving an image and performing various image processing related thereto. The image forming apparatus 100 may be a Multi-Function Peripheral (MFP) or a Single Function Peripheral (SFP).

A central processing unit (CPU) 101 is for controlling each element constituting the image forming apparatus 100, and is connected to each element via a system bus 120. A random access memory (RAM) 102 is a readable/writable memory for providing a work area as a main memory for the CPU 101. The RAM 102 is also used as an image memory for temporarily storing image data subjected to internal processing. A read only memory (ROM) 103 is a boot ROM for storing a boot program required for system activation and various processing programs required for system operations.

A hard disk drive (HDD) 104 is a nonvolatile data storage device for storing various data such as image data, system data, and user data, and operation programs to be executed by the CPU 101. Although described in detail below, second configuration data of a Field-Programmable Gate Array (FPGA) 201 connected as an extended processing unit 114 is also stored in the HDD 104. Other storage devices such as a solid state drive (SSD) may be provided instead of or together with the HDD 104.

A network (NW) communication unit 105, serving as an interface for connecting with a network such as a local area network (LAN), outputs and inputs information to/from the network.

An operation unit interface (I/F) 106 is an interface for outputting and inputting data to/from an operation unit 115 having, for example, a liquid crystal touch panel. The operation unit I/F 106 is used to output image data to be displayed on the operation unit 115, and transmit to the CPU 101 information input from a user via the operation unit 115.

An image bus I/F 107, serving as an interface for connecting the system bus 120 and an image bus 130 for transmitting image data, operates as a bus bridge for converting a data structure. A printer image processing unit 109, a scanner image processing unit 110, and a device I/F 111 are connected to the image bus 130.

The printer image processing unit 109 performs color conversion, filter processing, resolution conversion, etc. on print output image data to be output to a printer 113. The scanner image processing unit 110 performs image processing such as correction, modification, editing, etc. on input image data read from a scanner 112.

The device I/F 111, serving as an interface for connecting the scanner 112 and the printer 113 to the image bus 130, performs synchronous and asynchronous conversion on image data. An external media I/F 116 is an interface to which an external storage medium such as a universal serial bus (USB) mass storage device is connectable.

An extension I/F 108 composed of Peripheral Component Interconnect (PCI) Express, etc. is an interface for connecting a peripheral device. In the present exemplary embodiment, the extension I/F 108 is connected to the extended processing unit 114. The extended processing unit 114 according to the present exemplary embodiment includes the FPGA 201 as a programmable logic device (a programmable processing unit), and will be described in detail below.

<Configuration of Extended Processing Unit 114>

Figure 2:
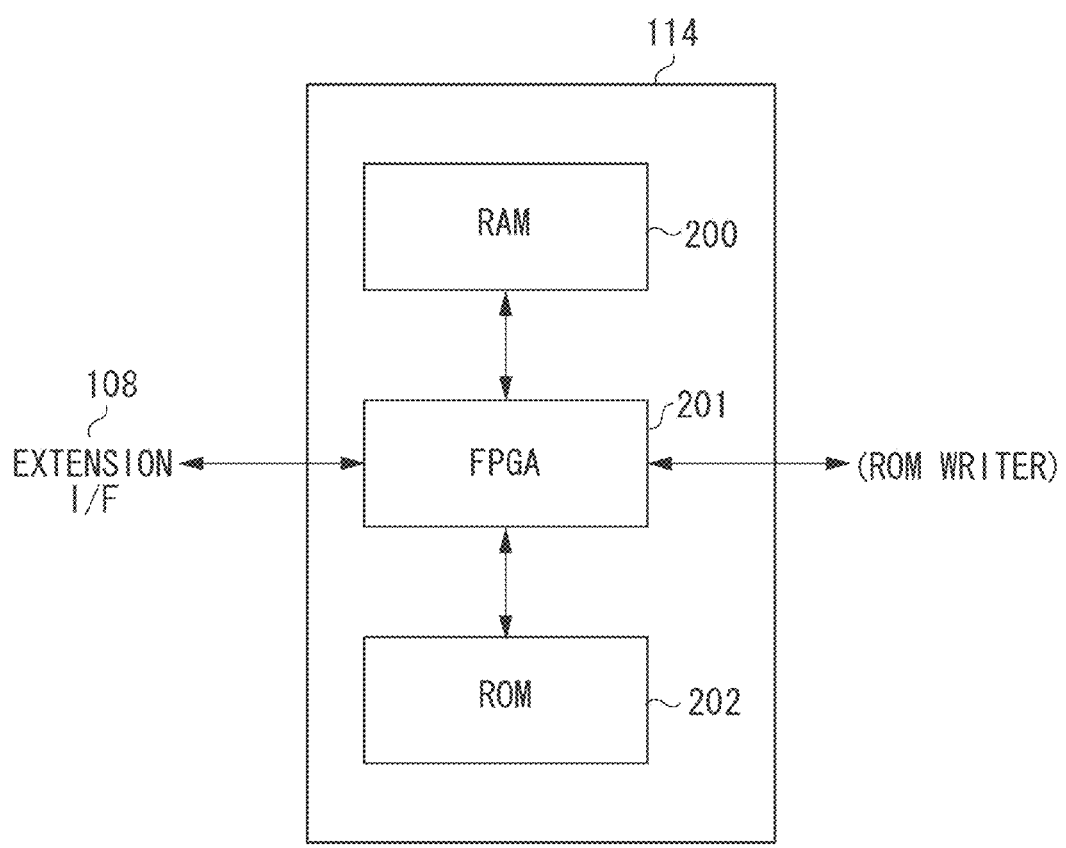
FIG. 2 illustrates an example of a configuration of an extended processing unit according to the present exemplary embodiment.

FIG. 2 illustrates an example of a configuration of the extended processing unit 114.

As illustrated in FIG. 2, the extended processing unit 114 includes a RAM 200, the FPGA 201, and a ROM 202.

The RAM 200 is a main memory used by the FPGA 201 during operation and is used to temporarily store intermediate processing data of image data. The FPGA 201 is a reconfigurable device in which logic circuits can be changed according to circuit configuration data. The circuit configuration data of the FPGA 201 is roughly divided into the first and the second configuration data. The FPGA 201 and the circuit configuration data will be described in detail below.

The ROM 202 is a nonvolatile memory for storing circuit configuration data of the FPGA 201. The circuit configuration data stored in the ROM 202 is the first configuration data which is loaded by a configuration controller 302 illustrated in FIG. 3 (described below) during activation of the FPGA 201. A sequence for loading the circuit configuration data will be described below. The first configuration data stored in the ROM 202 is rewritable by an external ROM writer connected to the FPGA 201.

<Configuration of FPGA 201>

Figure 3:
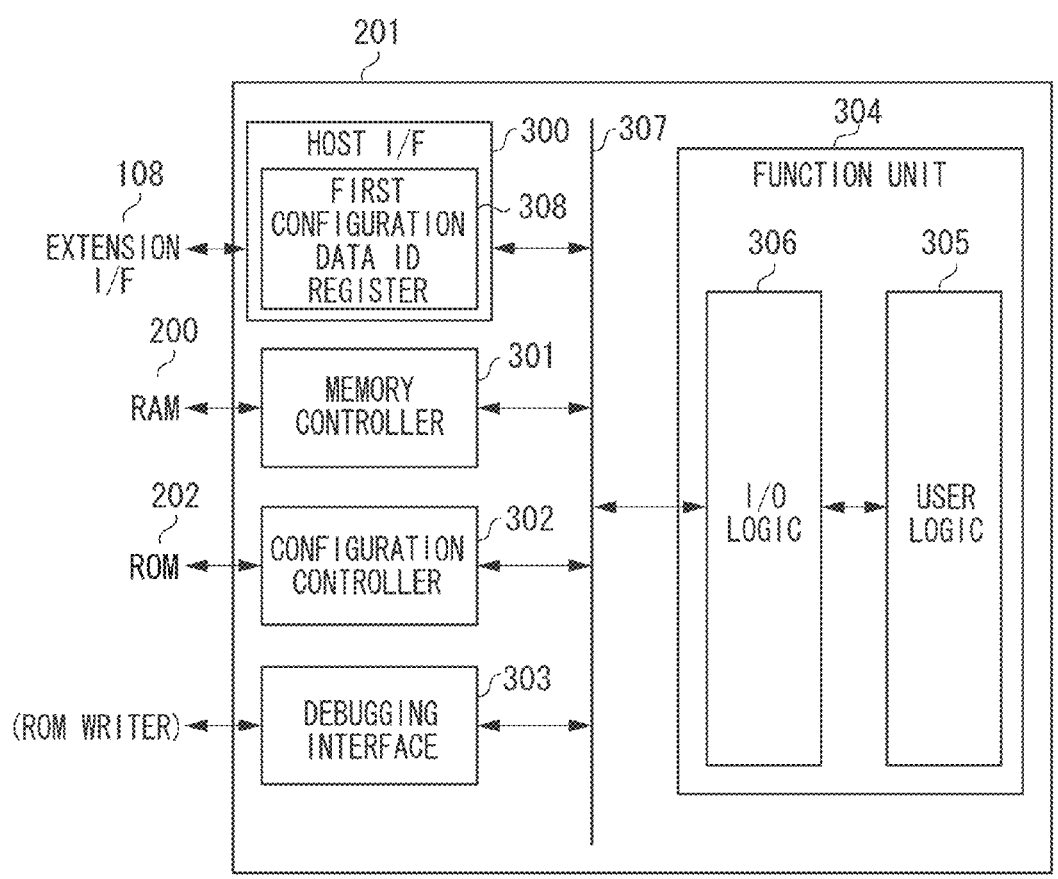
FIG. 3 illustrates an example of a configuration of a Field-Programmable Gate Array (FPGA) according to the present exemplary embodiment.

FIG. 3 illustrates an example of a configuration of the FPGA 201.

Referring to FIG. 3, a host I/F 300, serving as an interface block for connecting the extension I/F 108 and the FPGA 201, has a PCI Express function in the present exemplary embodiment. The host I/F 300 includes a first configuration data identifier (ID) register 308 required to check consistency between the first and the second configuration data. The first configuration data ID register 308 will be described below.

A memory controller 301, serving as an interface control unit connected to the RAM 200, performs memory control based on a data read request and a data write request from the CPU 101 received via a function unit 304 and the host I/F 300.

The configuration controller 302, serving as an interface control unit connected to the ROM 202, performs control based on a circuit configuration data read request from the function unit 304 and a circuit configuration data write request from a debugging interface 303.

The debugging interface 303, serving as an interface composed of, for example, Joint Test Action Group (JTAG), achieves function verification for the function unit 304 and the circuit configuration data writing in the ROM 202.

The function unit 304 includes a user logic unit 305 and an input/output (I/O) logic unit 306.

The user logic unit 305 is a block in which main processing functions of the FPGA 201 are implemented. In the case of the image forming apparatus 100, the user logic unit 305 implements such functions as image data compression/decompression processing and image recognition processing.

The I/O logic unit 306 is an interface block between the user logic unit 305 and an internal bus 307 of the FPGA 201. The I/O logic unit 306 includes a clock signal connection to the user logic unit 305.

<Circuit Configuration Data 400>

Figure 4:
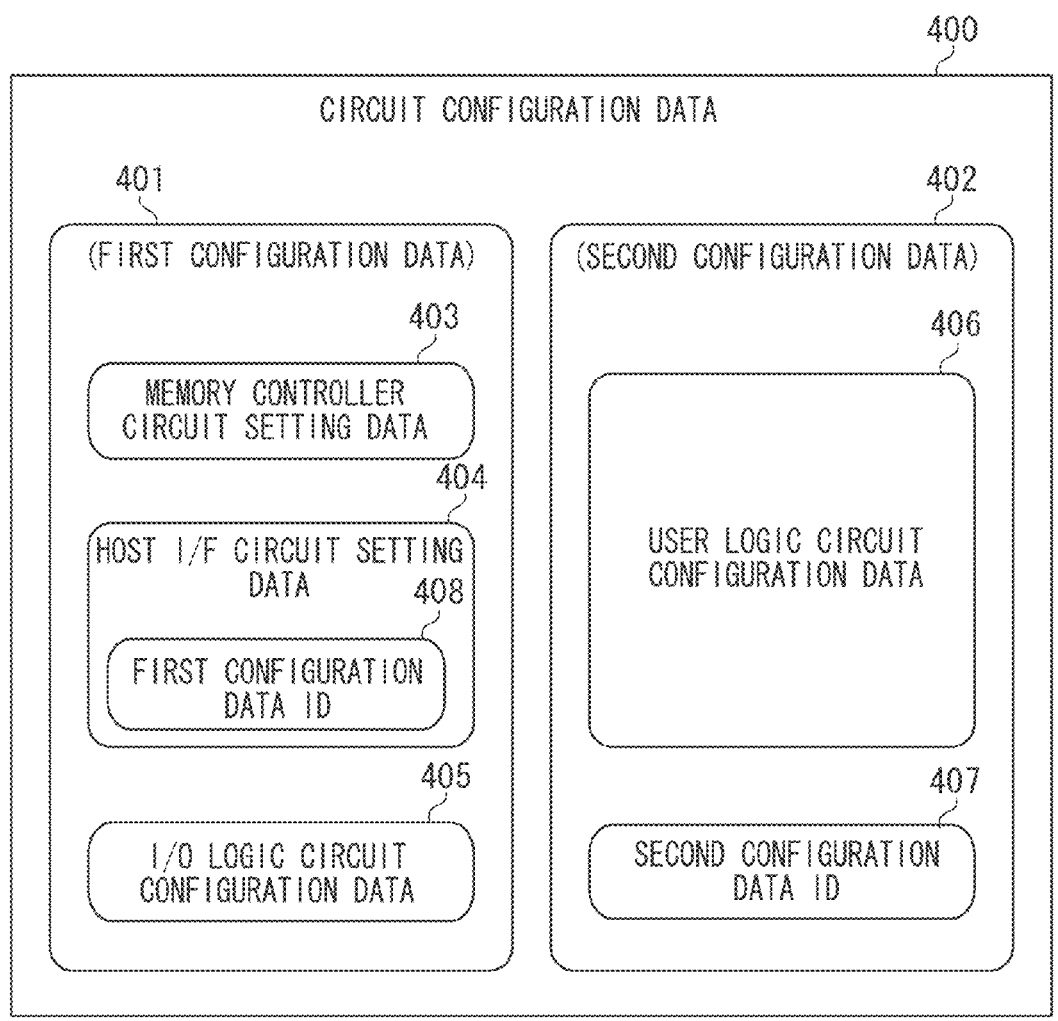
FIG. 4 is a schematic view illustrating details of circuit configuration data according to the present exemplary embodiment.

FIG. 4 is a schematic view illustrating contents of circuit configuration data according to the present exemplary embodiment.

As described above, circuit configuration data 400 of the FPGA 201 is roughly divided into first configuration data 401 and second configuration data 402.

The first configuration data 401 includes memory controller circuit setting data 403, host I/F circuit setting data 404, and I/O logic circuit configuration data 405. The first configuration data 401 is stored in the ROM 202 and is loaded into the FPGA 201 by the configuration controller 302 during activation of the FPGA 201. A sequence for loading the circuit configuration data 400 will be described below.

The memory controller circuit setting data 403 includes register setting values of the memory controller 301. When the configuration controller 302 loads the memory controller circuit setting data 403 into the FPGA 201, the memory controller 301 enters a usable state.

The host I/F circuit setting data 404 includes register setting values of the host I/F 300. When the configuration controller 302 loads the host I/F circuit setting data 404 into the FPGA 201, the host I/F 300 enters the usable state. The host I/F circuit setting data 404 includes a first configuration data ID 408 which is an identifier for checking the consistency between the first and the second configuration data 401 and 402.

The first configuration data ID 408 is a hash value uniquely determined through a hash function such as Message Digest (MD)5 using as a key the contents of the circuit setting data and the circuit configuration data included in the first configuration data 401 and further the device type of the FPGA 201. When loading the first configuration data 401, the configuration controller 302 loads and retains the value of the first configuration data ID 408 in the first configuration data ID register 308. A sequence for generating the first configuration data ID 408 will be described below.

The I/O logic circuit configuration data 405 is circuit configuration data of the I/O logic unit 306. When the configuration controller 302 loads the I/O logic circuit configuration data 405 into the FPGA 201, a circuit of the I/O logic unit 306 is configured.

The second configuration data 402 includes user logic circuit configuration data 406, and a second configuration data ID 407 which is an identifier for checking the consistency between the first and the second configuration data 401 and 402.

The user logic circuit configuration data 406 is circuit configuration data of the user logic unit 305. When the user logic circuit configuration data 406 is loaded into the FPGA 201, a circuit of the user logic unit 305 is configured.

The second configuration data ID 407 is a parameter having an identical value to the first configuration data ID 408 included in the host I/F circuit setting data 404. A sequence for generating the second configuration data ID 407 will be described below.

Comparing the first configuration data ID register 308 with the second configuration data ID 407 enables checking the consistency between the first and the second configuration data 401 and 402. This comparison is included in a sequence for installing the second configuration data 402, and will be described in detail below.

<Sequence for Loading Circuit Configuration Data 400>

The timing of loading the first and the second configuration data 401 and 402 will be described below with reference to the flowchart illustrated in FIG. 5.

FIG. 5 is a flowchart illustrating an example of the sequence for loading the circuit configuration data 400 according to the first exemplary embodiment. The processing in the flowchart illustrated in FIG. 5 is executed by the configuration controller 302 at a timing when power is supplied to the extended processing unit 114.

In step S500, the configuration controller 302 loads into the FPGA 201 the first configuration data 401 stored in the ROM 202. When the first configuration data 401 is loaded into the FPGA 201, the host I/F 300 and the memory controller 301 become usable, and a circuit of the I/O logic unit 306 is configured. At this timing, the configuration controller 302 loads and retains the value of the first configuration data ID 408 in the first configuration data ID register 308.

Upon completion of loading of the first configuration data 401, the FPGA 201 waits for loading of the second configuration data 402. The loading of the second configuration data 402 starts by a configuration request from the CPU 101. Prior to loading the second configuration data 402, in step S501, the FPGA 201 waits for a configuration request from the CPU 101. The CPU 101 is able to determine whether the FPGA 201 is waiting for a configuration request by reading the register value of the host I/F 300 via the extension I/F 108.

When the FPGA 201 receives a configuration request from the CPU 101, then in step S502, the configuration controller 302 receives the second configuration data 402 from the HDD 104 via the host I/F 300 and then loads the second configuration data 402 into the FPGA 201. When loading of the second configuration data 402 is completed, the main processing functions implemented in the user logic unit 305 becomes executable.

As described in "BACKGROUND OF THE INVENTION", if the first and the second configuration data 401 and 402 in this sequence are inconsistent with each other, the FPGA 201 will malfunction. To solve this issue, when installing the second configuration data 402 in the HDD 104, the present exemplary embodiment compares the first configuration data ID register 308 with the second configuration data ID 407 to determine whether the above-described installation is to be performed. This configuration enables preventing a configuration failure due to the installation of the second configuration data 402, which is inconsistent with the first configuration data 401, in the HDD 104. The comparison between the first and the second configuration data 401 and 402 is included in the sequence for installing the second configuration data 402, and will be described in detail below.

<Sequence for Generating First and Second Configuration Data IDs 408 and 407>

A sequence for generating the first and the second configuration data IDs 408 and 407 according to the present exemplary embodiment will be described below with reference to FIG. 6.

FIG. 6 is a flowchart illustrating an example of the sequence for generating the first and the second configuration data IDs 408 and 407 according to the present exemplary embodiment. The generation of FPGA circuit configuration data is performed on a personal computer (PC) or server not described in the present specification. A method of the generation is a known general method, and redundant descriptions thereof will be omitted. The processing in the flowchart illustrated in FIG. 6 is executed by the CPU of the PC or server at a timing immediately after the generation of the circuit configuration data. The above-described processing is implemented when the CPU of the PC or server reads and executes a program stored in the HDD of the PC or server.

In step S600, the CPU of the PC or server performs processing for dividing the circuit configuration data generated by the PC or server into the first and the second configuration data 401 and 402. The contents of data included in the first and the second configuration data 401 and 402 are as illustrated in FIG. 4. In step S600, the first and the second configuration data ID 408 and 407 become initial values (for example, zero values). The specific method for dividing the configuration data is a known method, and redundant descriptions thereof will be omitted.

In step S601, the CPU of the PC or server performs general hash calculation, such as MD5 using as a key the first configuration data 401 generated through division in step S600, to acquire a hash value.

In step S602, the CPU embeds the hash value acquired in step S601 into the first and the second configuration data 401 and 402 as the first and the second configuration data ID 408 and 407, respectively. The configuration data ID is not limited to a hash value, and may be any value as long as it serves as an identifier of the configuration data.

<Installation of Second Configuration Data 402>

The installation of the second configuration data 402 will be described below with reference to FIG. 7A to 7C.

Figure 7A:
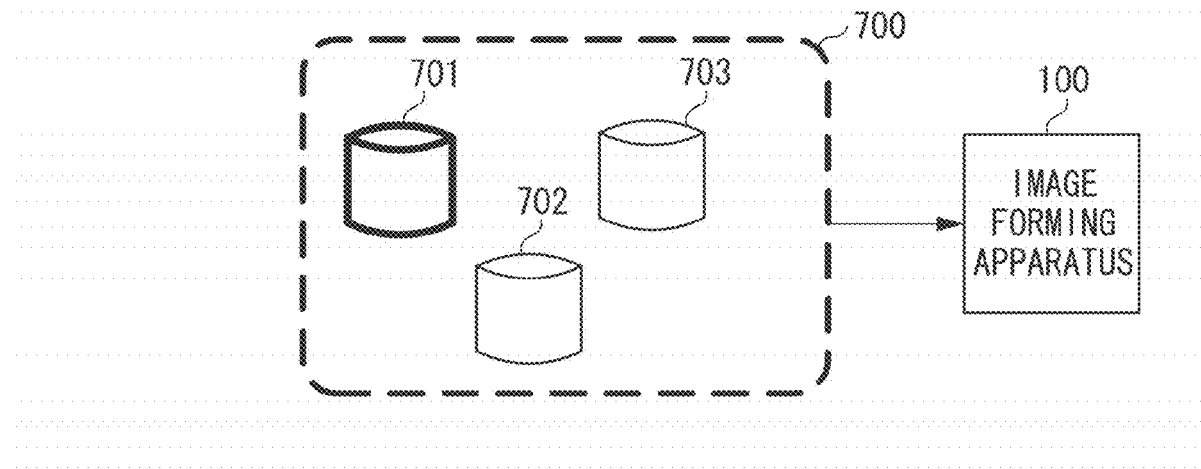
FIGS. 7A, 7B, and 7C illustrate a sequence for installing second configuration data according to a first exemplary embodiment.
Figure 7B:
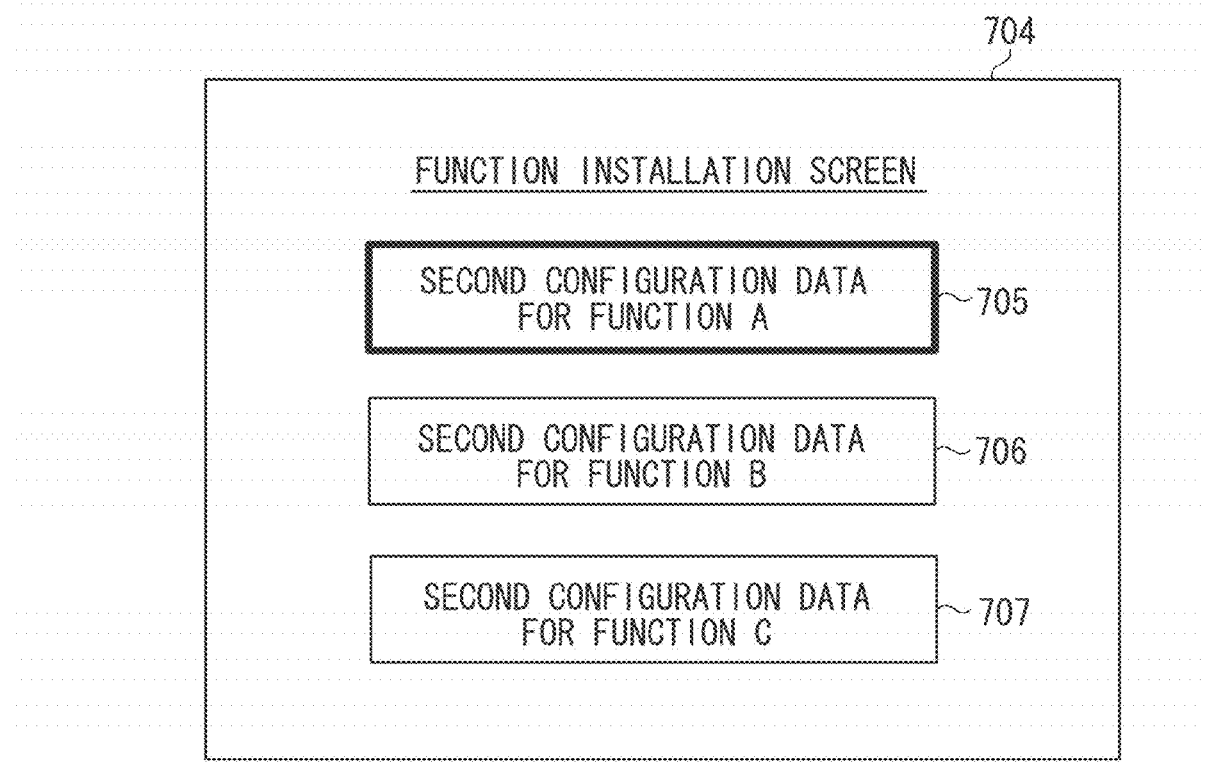
Figure 7C:
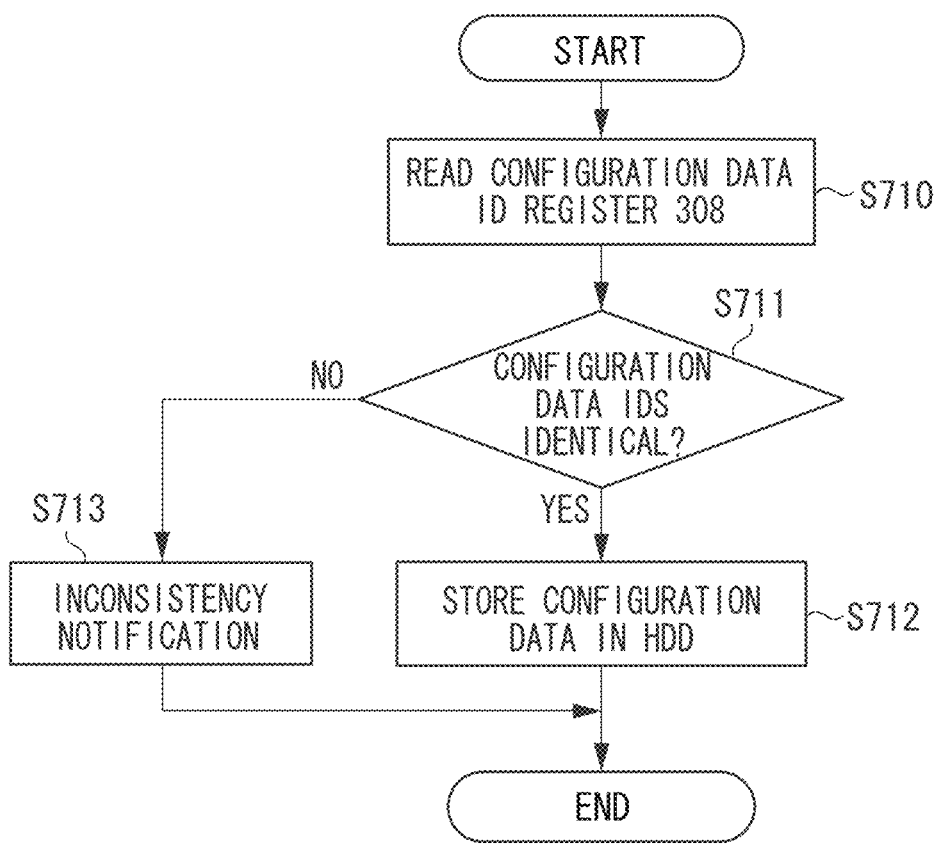

FIGS. 7A to 7C illustrate a sequence for installing the second configuration data 402 according to the first exemplary embodiment.

FIG. 7A illustrates a concept of a location of the second configuration data 402 immediately before installing the data. A data storage space 700 is a storage area managed by a network server accessible via the NW communication unit 105 or is an external medium accessible via the external media I/F 116.

Respective pieces of the second configuration data 701 to 703 are the independent second configuration data 402. These pieces of second configuration data 701 to 703 are selected as installation candidates as required via the operation unit 115 of the image forming apparatus 100. The sequence for installing the second configuration data 402 (described below) is performed on the selected second configuration data.

FIG. 7B illustrates an example of a display screen on the operation unit 115 of the image forming apparatus 100 immediately before the installation of the second configuration data 402. The display illustrated in FIG. 7B is to be considered as an example.

A function installation screen 704 is a screen displayed on the display of the operation unit 115. This function installation screen 704 is displayed on the display of the operation unit 115 by the CPU 101 in response to a function installation instruction input from the user input via the operation unit 115.

Icons 705 to 707 can be separately selected by the user and correspond to the second configuration data illustrated in FIG. 7A. More specifically, the icons 705, 706, and 707 correspond to the second configuration data 701, 702, and 703, respectively. For example, by selecting the icon 705, the user is able to select the second configuration data 701 as a target of the installation sequence (described below).

The sequence for installing the second configuration data 402 will be described below with reference to a flowchart illustrated in FIG. 7C. As illustrated in FIGS. 7A and 7B, the flowchart illustrated in FIG. 7C is executed by the CPU 101 at a timing when the second configuration data 402 subject to an installation target is selected via the operation unit 115. The CPU 101 implements the processing illustrated in FIG. 7C by reading and executing a program stored in the HDD 104.

In step S710, the CPU 101 reads the value of the first configuration data ID register 308 included in the host I/F 300 via the extension I/F 108.

In step S711, the CPU 101 compares the configuration data ID in the installation target second configuration data 402 with the value of the first configuration data ID register 308 read in step S710, to determines whether these values are identical. The installation target second configuration data 402 is the second configuration data corresponding to the icon selected on the function installation screen 704 illustrated in FIG. 7B.

When the CPU 101 determines that the configuration data ID in the installation target second configuration data 402 coincides with the value of the first configuration data ID register 308 (YES in step S711), the processing proceeds to step S712.

In step S712, the CPU 101 stores the above-described installation target second configuration data 402 in the HDD 104. Then, the processing exits this flowchart.

On the other hand, when the CPU 101 determines that the configuration data ID in the installation target second configuration data 402 does not coincide with the value of the first configuration data ID register 308 (NO in step S711), the processing proceeds to step S713.

In step S713, the CPU 101 notifies the user that the installation target second configuration data 402 is inconsistent data (an inconsistency notification) via the operation unit 115. Then, the processing exits this flowchart. The CPU 101 makes the above-described inconsistency notification, for example, by displaying a message indicating that the installation target second configuration data 402 is inconsistent data on the display of the operation unit 115.

As a result of the above-described processing, only the second configuration data 402 settable to the FPGA 201 is stored in the HDD 104, and the second configuration data 402 not settable to the FPGA 201 is not stored therein. At least one piece of the second configuration data 402 can be stored in the HDD 104. At a timing when the corresponding function is executed, the CPU 101 reads the corresponding second configuration data 402 from the HDD 104 and sets the data in the FPGA 201.

In the first exemplary embodiment, as described above, the CPU 101 embeds the configuration data ID into the first and the second configuration data 401 and 402 in a CPU master configuration, and compares these IDs when installing the second configuration data 402. When the two configuration data IDs are identical as a result of the comparison, the CPU 101 performs control to enable installing the second configuration data 402 (so that the second configuration data 402 is stored in the HDD 104). On the other hand, when the two configuration data IDs are not identical, the CPU 101 performs control to disable the installation of the second configuration data 402 (so that the second configuration data 402 is not stored in the HDD 104). This configuration allows the user to check the consistency of the configuration data prior to the configuration, thus preventing malfunctions of the apparatus. As a result, when installing the configuration data of the FPGA 201, a product user is able to correctly perform complicated installation operations without being conscious of a type of hardware such as a programmable logic device.

According to the above first exemplary embodiment, when the installation target second configuration data 402 is selected, the CPU 101 determines the consistency between the first and the second configuration data 401 and 402, and, when these pieces of data are consistent with each other, installs the second configuration data 402 in the HDD.

The image forming apparatus 100 according to a second exemplary embodiment is configured to selectably display on the function installation screen 704 only the second configuration data 402 consistent with the first configuration data 401 when displaying the function installation screen 704. Referring to FIGS. 1 to 6, the configuration of the present second exemplary embodiment is similar to that of the first exemplary embodiment, and redundant descriptions thereof will be omitted. The second exemplary embodiment differs from the first exemplary embodiment only in the installation of the second configuration data 402. The installation of the second configuration data 402 will be described below with reference to FIGS. 8A to 8C.

Figure 8A:
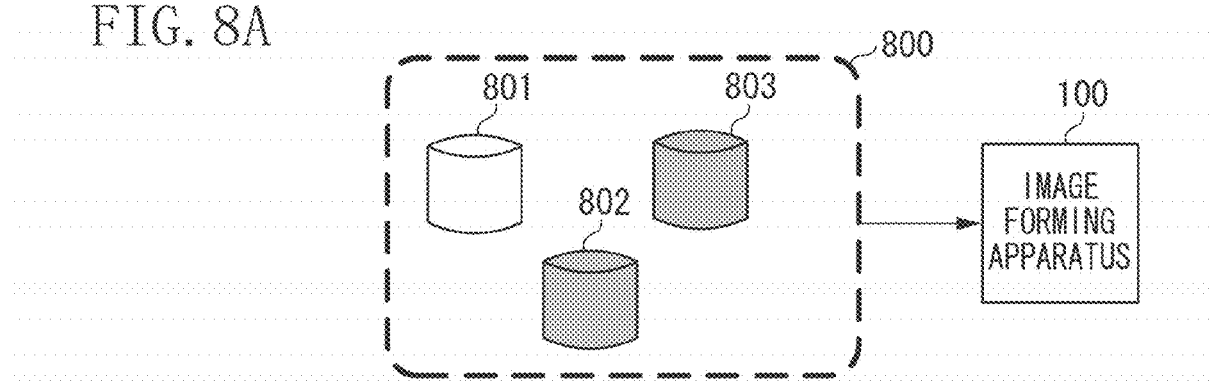
FIGS. 8A, 8B, and 8C illustrate a sequence for installing second configuration data according to a second exemplary embodiment.
Figure 8B:
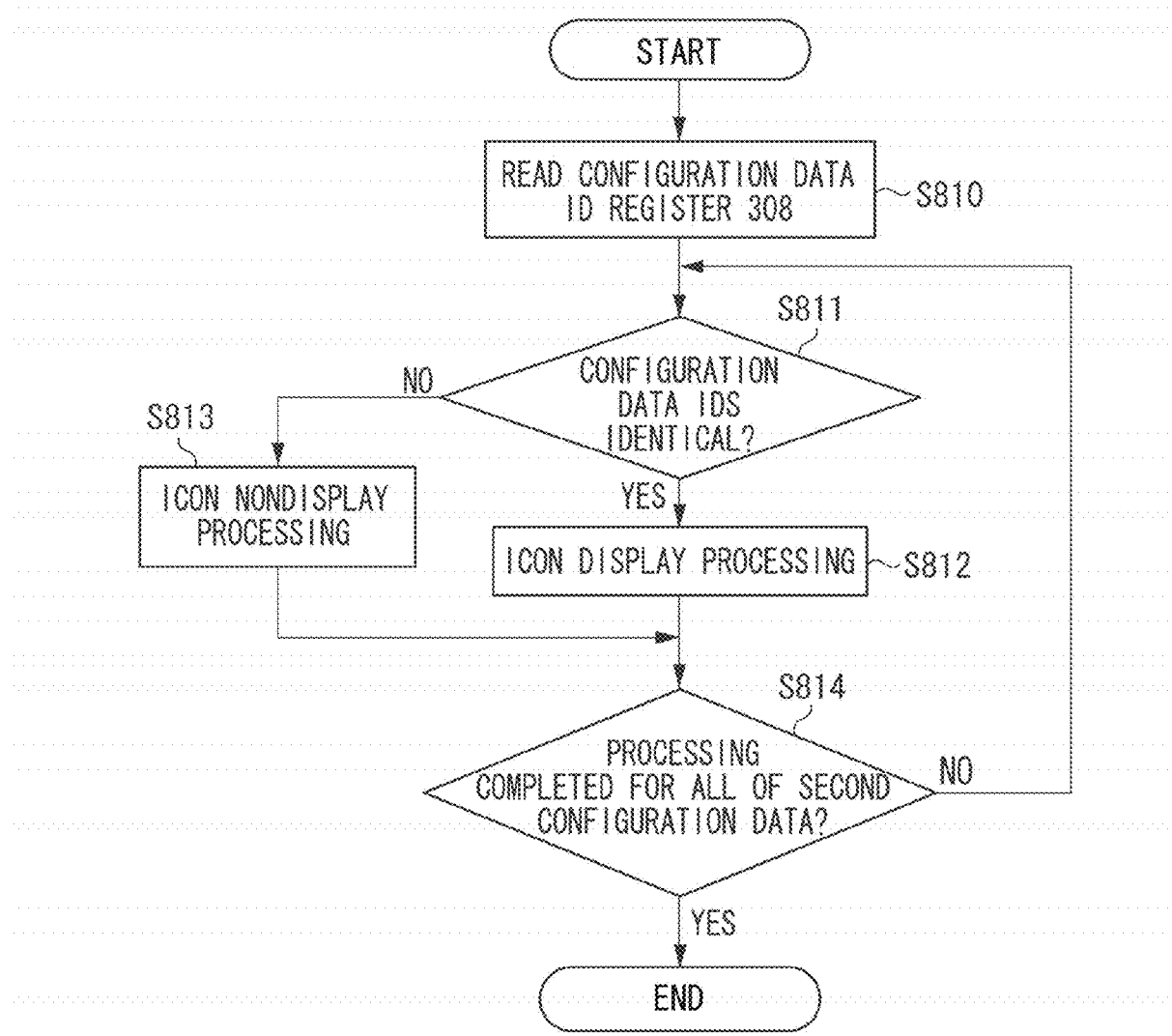
Figure 8C:
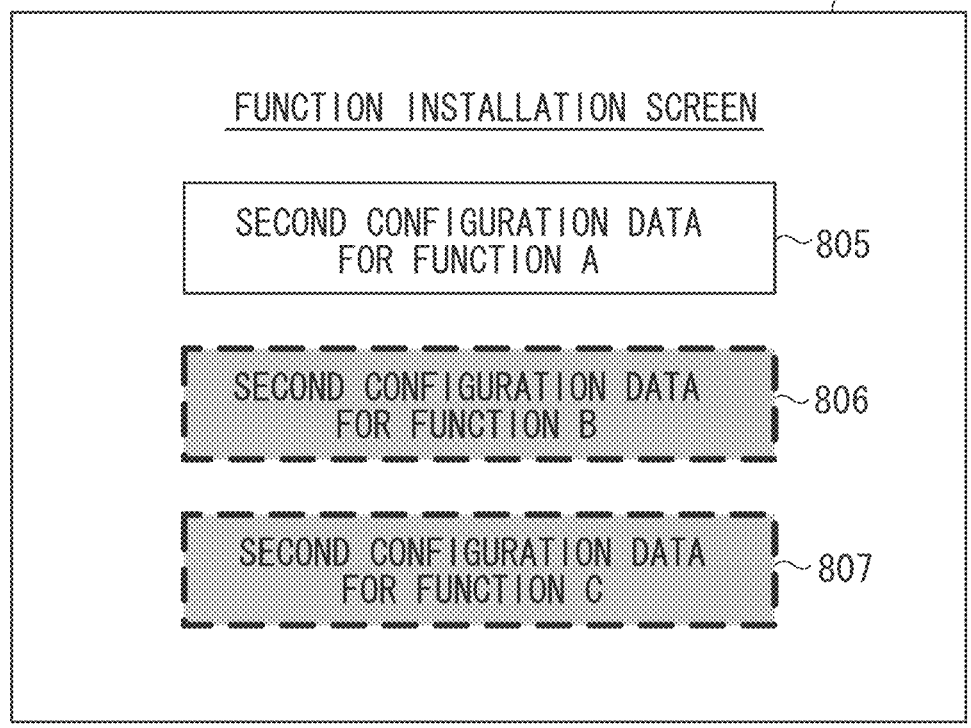

FIGS. 8A to 8C illustrate a sequence for installing the second configuration data 402 according to the second exemplary embodiment.

FIG. 8A illustrates a concept of a location of the second configuration data 402 immediately before installing the data. A data storage space 800 is a network server accessible via the NW communication unit 105 or an external medium accessible via the external media I/F 116.

Respective pieces of the second configuration data 801 to 803 are the independent second configuration data 402. The second configuration data 801 is consistent with the first configuration data 401 in the image forming apparatus 100. On the other hand, the second configuration data 802 and 803 are inconsistent with the first configuration data 401 in the image forming apparatus 100.

According to the above-described first exemplary embodiment, the installation sequence illustrated in FIG. 7C is performed on the second configuration data 402 selected as an installation candidate via the operation unit 115 out of the above-described second configuration data 402. On the other hand, according to the present second exemplary embodiment, immediately before displaying a second configuration data selection screen on the operation unit 115, a sequence for displaying the second configuration data 402 illustrated in FIG. 8B is performed on all of the second configuration data in the data storage space 800.

The sequence for displaying the second configuration data 402 will be described below with reference to the flowchart illustrated in FIG. 8B. As described above, the flowchart illustrated in FIG. 8B is executed by the CPU 101 at a timing immediately before displaying the second configuration data selection screen on the operation unit 115 in response to a function installation instruction input from a user via the operation unit 115. The CPU 101 implements the processing illustrated in FIG. 8B by reading and executing a program stored in the HDD 104.

In step S810, the CPU 101 reads the value of the first configuration data ID register 308 included in the host I/F 300 via the extension I/F 108.

In step S811, the CPU 101 selects either one piece of the second configuration data in the data storage space 800 as the second configuration data 402 subject to a processing target. The CPU 101 further compares the processing target configuration data ID with the value of the first configuration data ID register 308 read in step S810 to determine whether these values are identical.

When the CPU 101 determines that the configuration data ID in the processing target second configuration data 402 and the value of the first configuration data ID register 308 are identical (YES in step S811), the processing proceeds to step S812.

In step S812, the CPU 101 selectably displays an icon corresponding to the above-described processing target second configuration data 402 in a function installation screen 804 (see FIG. 8C) displayed on the display of the operation unit 115 (icon display processing), and the processing proceeds to step S814.

On the other hand, when the CPU 101 determines that the configuration data ID in the processing target second configuration data 402 and the value of the first configuration data ID register 308 are not identical (NO in step S811), the processing proceeds to step S813.

In step S813, the CPU 101 does not display an icon corresponding to the above-described processing target second configuration data 402 in the function installation screen 804 (see FIG. 8C) displayed on the display of the operation unit 115 (icon nondisplay processing). Then, the processing proceeds to step S814. The icon nondisplay processing refers to processing for displaying the corresponding icon in grayout to disable selection, or to processing for hiding the corresponding icon.

In step S814, the CPU 101 determines whether the processing in steps S811 to S813 is completed for all of the second configuration data in the data storage space 800.

When the CPU 101 determines that the processing in steps S811 to S813 is completed not for all of the second configuration data in the data storage space 800 (NO in step S814), the processing returns to step S811. The CPU 101 performs the processing in steps S811 to S813 on unprocessed second configuration data 402.

On the other hand, when the CPU 101 determines that the processing in steps S811 to S813 is completed for all of the second configuration data in the data storage space 800 (YES in step S814), the processing exits this flowchart.

FIG. 8C illustrates an example of a display screen of the operation unit 115 of the image forming apparatus 100 immediately before the installation of the second configuration data 402.

The function installation screen 804 is an example of a display screen displayed as a result of the sequence for displaying the second configuration data 402 illustrated in FIG. 8B. The display illustrated in FIG. 8C is to be considered as an example. The function installation screen 804 is displayed on the display of the operation unit 115.

Icons 805 to 807 can be separately selected and correspond to the second configuration data 402 illustrated in FIG. 8A. More specifically, the icons 805, 806, and 807 correspond to the second configuration data 801, 802, and 803, respectively.

As described above, the second configuration data 801 is consistent with the first configuration data 401 in the image forming apparatus 100. On the other hand, the second configuration data 802 and 803 are inconsistent with the first configuration data 401 in the image forming apparatus 100. Therefore, as a result of performing the sequence for displaying the second configuration data 402 illustrated in FIG. 8B, the icon 805 is selectable and the icons 806 and 807 are displayed in grayout to be unselectable. As described above, the icons 806 and 807 may not be displayed.

For example, when the user selects the icon 805, the second configuration data 801 can be selected as a target of the installation sequence and installed in the HDD 104. On the other hand, the user cannot select the icon 806 or 807 and therefore cannot install the second configuration data 802 or 803 in the HDD 104.

In the present exemplary embodiment, when the installation target second configuration data 402 is selected on the display screen 804 illustrated in FIG. 8C, the CPU 101 performs similar processing to that in step S712 illustrated in FIG. 7C, and stores in the HDD 104 the second configuration data 402 corresponding to the selected icon. For example, when the user selects the icon 805, the CPU 101 stores the second configuration data 801 in the HDD 104.

As described above, in the second exemplary embodiment, the CPU 101 embeds the configuration data ID into each of the first and second configuration data 401 and 402 in the CPU master configuration, and compares these configuration data IDs when the second configuration data icons are displayed on the display screen 804. When the configuration data IDs are determined to be identical as a result of the comparison, the CPU 101 performs control to enable installing the second configuration data 402 (icon display control). On the other hand, when the configuration data IDs are not identical, the CPU 101 performs control to disable the installation of the second configuration data 402 (icon nondisplay control). This configuration allows the user to check the consistency of the configuration data prior to the configuration, thus preventing malfunctions of the apparatus. As a result, when installing the configuration data of the FPGA 201, a product user is able to correctly perform complicated installation operations without being conscious of a type of hardware such as a programmable logic device.

A third exemplary embodiment of the present disclosure will be described below centering on the processing performed when the first configuration data 401 is updated.

When the first configuration data 401 stored in the ROM 202 is updated, it becomes inconsistent with the second configuration data 402 stored in the HDD 104 before the update. More specifically, the configuration cannot be normally performed by using the second configuration data 402 which has been usable. For this reason, it becomes necessary to update the second configuration data 402 according to the update of the first configuration data 401.

In the image forming apparatus 100 according to the third exemplary embodiment, when the first configuration data 401 to be set in the FPGA 201 stored in the ROM 202 is updated, the CPU 101 performs control in the following way. More specifically, the CPU 101 performs processing for updating the second configuration data 402 stored in the HDD 104 in step S712 illustrated in FIG. 7C.

In this update processing, the CPU 101 acquires from a preset predetermined storage area the second configuration data 402 including the second configuration data ID 407 identical to the above-described first configuration data ID 408 included in the updated first configuration data 401. The predetermined storage area is, for example, the data storage space 700 or 800. The CPU 101 updates the second configuration data 402 stored in the HDD 104 with the acquired second configuration data 402. The above-described second configuration data 402 may be updated in such a way that all of the second configuration data 402 is updated at a timing when the first configuration data 401 is updated. Further, at a timing when a function corresponding to the second configuration data 402 is executed, the second configuration data 402 corresponding to the function to be executed may be updated.

The first configuration data 401 is updated in the following cases.

For example, the first configuration data 401 is updated, for example, in a case where a bug in the first configuration data 401 is corrected, or in a case of enabling the installation of a function that was not initially assumed when the first configuration data 401 was generated into the image forming apparatus 100 (for example, in a case of function extension). However, cases where the first configuration data 401 is updated are not limited thereto.

As described above, the first configuration data 401 stored in the ROM 202 is rewritable by an external ROM writer connected to the FPGA 201. In this configuration, the first configuration data 401 is updated by a service engineer, and the like. For example, when the image forming apparatus 100 receives a first configuration data update notification from a server, the CPU 101 displays a message for prompting update of the first configuration data 401 by a service engineer on the display of the operation unit 115 to notify a user of the message. Further, if the user cannot select the second configuration data 402 including the second configuration data ID 407 identical to the value of the first configuration data ID register 308 corresponding to a function to be installed by the user, the CPU 101 may issue the above-described first configuration data update notification. In this case, the CPU 101 makes an inquiry to a preset server about whether the first configuration data 401 corresponding to the function to be installed exists and, when it exists, issues the above-described first configuration data update notification to the server. In some cases, the user cannot select the second configuration data 402 including the second configuration data ID 407 identical to the value of the first configuration data ID register 308 corresponding to the function to be installed by the user. Such cases include, for example, a case where the inconsistency notification illustrated in FIG. 7C in step S713 is performed and a case where none of selectable icons for the configuration data is displayed as a result of the processing illustrated in FIG. 8B.

In a case where the ROM 202 being composed of a flash ROM is rewritable without an external ROM writer, the user may enable updating the first configuration data 401 in response to the above-described first configuration data update notification. In this case, for example, the user presses an update button displayed on the display of the operation unit 115 in relation to the above-described first configuration data update notification. In response to the button depression, the CPU 101 may acquire the first configuration data 401 corresponding to the model of the image forming apparatus 100 from a preset server, and update the first configuration data 401.

The above-described operations of the CPU 101 related to the update of first configuration data 401 are implemented when the CPU 101 reads and executes a program stored in the HDD 104.

The image forming apparatus 100 according to the third exemplary embodiment is configured to update the second configuration data 402 installed in the HDD 104 according to the update of the first configuration data 401. This configuration enables checking the consistency of the configuration data even when the first configuration data 401 is updated, thus preventing malfunctions of the apparatus.

Although, in the above-described exemplary embodiments, an image forming apparatus (an image processing apparatus) is described as an example of an information processing apparatus of the present invention, the information processing apparatus of the present invention is not limited to an image forming apparatus (an image processing apparatus). The information processing apparatus of the present invention may be an information processing apparatus of any type as long as it has a programmable processing unit which needs at least two different pieces of circuit configuration data for circuit configuration. For example, the information processing apparatus of the present invention may be a personal computer, a tablet terminal, a television, an audio unit, a home appliance (such as an air conditioner and a refrigerator), a car navigation system, a camera, and the like.

As described above, it becomes possible to prevent malfunctions of the apparatus by embedding the configuration data ID into each of the first and the second configuration data 401 and 402 and, when installing the second configuration data 402, comparing these configuration data IDs to check the consistency between the first and the second configuration data 401 and 402. The following effects are provided by determining in this way the consistency of new circuit data to be added in the FPGA. More specifically, when installing the configuration data of the FPGA, the product user is able to correctly perform complicated installation operations without being conscious of hardware such as a programmable logic device.

While the present invention has specifically been described above based on the above-described various data configurations and contents, the present invention is not limited thereto but diverse data configurations and contents are applicable according to applications and purposes.

Although the present invention has been described above centering on a plurality of exemplary embodiments, the present invention can be embodied, for example, as a system, an apparatus, a method, a program, or a storage medium. More specifically, the present invention is applicable to a system composed of a plurality of apparatuses and to an apparatus composed of one device.

Further, all of configurations derived by suitably combining the above-described exemplary embodiments are also intended to be included in the present invention.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-186295, filed Sep. 24, 2015, which is hereby incorporated by reference herein in its entirety.

What is claimed is:

1. An information processing apparatus having a programmable logic device requiring at least two pieces of circuit configuration data for circuit configuration, the information processing apparatus comprising:
a storage which stores a first identifier indicating first circuit configuration data set in the programmable logic device; and
a controller which, in a case where the first identifier corresponds to a second identifier indicating second circuit configuration data, installs the second circuit configuration data, and, in a case where the first identifier does not correspond to the second identifier, does not install the second circuit configuration data and notifies a user of a predetermined message.

2. The information processing apparatus according to claim 1, wherein the controller compares the first identifier with the second identifier, and wherein, based on a result of the comparison by the controller, the controller determines whether to install the second circuit configuration data.

3. The information processing apparatus according to claim 1, further comprising a display unit which displays the predetermined message.

4. The information processing apparatus according to claim 3, wherein the display unit displays a selection screen for selecting installation target circuit configuration data from at least one piece of circuit configuration data, wherein, in the case where the first identifier corresponds to the second identifier indicating the second circuit configuration data selected via the selection screen, the controller installs the second circuit configuration data.

5. The information processing apparatus according to claim 3, wherein the display unit displays a selection screen for selecting installation target circuit configuration data from at least one piece of circuit configuration data, wherein, based on the first identifier corresponding to a plurality of the second identifiers, the display unit displays installable second circuit configuration data and uninstallable second circuit configuration data in such a manner that the installable second circuit and the uninstallable second circuit are distinguished.

6. The information processing apparatus according to claim 1, wherein the first identifier identifying the first circuit configuration data is generated based on the first circuit configuration data.

7. The information processing apparatus according to claim 1, wherein the information processing apparatus is an image processing apparatus.

8. A method for controlling an information processing apparatus having a programmable logic device requiring at least two pieces of circuit configuration data for circuit configuration, the method comprising:
storing a first identifier indicating first circuit configuration data set in the programmable logic device;
in a case where the first identifier corresponds to a second identifier indicating second circuit configuration data, installing the second circuit configuration data; and
in a case where the first identifier does not correspond to the second identifier, not installing the second circuit configuration data and notifying a user of a predetermined message.

9. A non-transitory computer-readable storage medium storing a program for causing a computer to execute a method for controlling an information processing apparatus having a programmable logic device requiring at least two pieces of circuit configuration data for circuit configuration, the method comprising:
storing a first identifier indicating first circuit configuration data set in the programmable logic device; and
in a case where the first identifier corresponds to a second identifier indicating second circuit configuration data, installing the second circuit configuration data; and
in a case where the first identifier does not correspond to the second identifier, not installing the second circuit configuration data and notifying a user of a predetermined message.

* * * * *